US012218663B2

(12) United States Patent
Simon

(10) Patent No.: US 12,218,663 B2
(45) Date of Patent: Feb. 4, 2025

(54) CONTROL DEVICE

(71) Applicant: APEM, Caussade (FR)

(72) Inventor: Charly Simon, Toulouse (FR)

(73) Assignee: APEM, Caussade (FR)

( * ) Notice: Subject to any disclaimer, the term of this patent is extended or adjusted under 35 U.S.C. 154(b) by 0 days.

(21) Appl. No.: 18/290,073

(22) PCT Filed: May 10, 2022

(86) PCT No.: PCT/FR2022/050897
§ 371 (c)(1),
(2) Date: Nov. 9, 2023

(87) PCT Pub. No.: WO2022/238657
PCT Pub. Date: Nov. 17, 2022

(65) Prior Publication Data
US 2024/0283453 A1 Aug. 22, 2024

(30) Foreign Application Priority Data

May 11, 2021 (FR) ...................................... 2104981

(51) Int. Cl.
*G05G 1/015* (2008.04)
*G01D 5/14* (2006.01)
(Continued)

(52) U.S. Cl.
CPC ............... *H03K 17/97* (2013.01); *G01D 5/14* (2013.01); *G05G 1/015* (2013.01); *G05G 1/04* (2013.01);
(Continued)

(58) Field of Classification Search
CPC ........... G05G 1/04; G05G 1/015; G05G 5/04; G05G 5/05
See application file for complete search history.

(56) References Cited

U.S. PATENT DOCUMENTS 6,566,619 B2 * 5/2003 Gillman .................. G05G 5/05
200/557
8,284,003 B2 10/2012 Klossek et al.
(Continued)

FOREIGN PATENT DOCUMENTS

CN 206411626 U * 8/2017 ............... G05G 5/05
DE 102016125222 A1 * 6/2018 ............. B60R 16/02
(Continued)

OTHER PUBLICATIONS

French Search Report in counterpart French Application No. 2104981 (issued on Dec. 8, 2021).
(Continued)

*Primary Examiner* — Daniel D Yabut
(74) *Attorney, Agent, or Firm* — Panitch Schwarze Belisario & Nadel LLP; Erin M. Dunston

(57) ABSTRACT

A control device comprising: a body comprising a printed circuit, a mobile actuator able to move in pivoting relative to the body about an axis 50 of rotation, a torsion spring comprising two end strands resting against two respective bearing surfaces of the actuator, said torsion spring being designed to urge the actuator to rotate towards a position of rest, at least one magnet rigidly secured to the actuator, a magnetic-field sensor arranged on the printed circuit facing the magnet and designed to detect the angular position of the magnet and to produce an electric signal dependent on the detected angular position, characterized in that it comprises two end-stops rigidly secured to the body, a respective elastic element being arranged between each end-stop and the body, each end-stop comprising a bearing surface bearing on a respective end strand of the torsion spring.

9 Claims, 7 Drawing Sheets

(51) Int. Cl.
*G05G 1/04* (2006.01)
*G05G 5/04* (2006.01)
*G05G 5/05* (2006.01)
*H03K 17/97* (2006.01)

(52) U.S. Cl.
CPC ............... *G05G 5/04* (2013.01); *G05G 5/05* (2013.01); *G05G 2505/00* (2013.01)

(56) References Cited

U.S. PATENT DOCUMENTS

2017/0083039 A1* 3/2017 Wuisan .................... G05G 5/05
2018/0059710 A1 3/2018 Wu
2018/0173310 A1* 6/2018 Geis ......................... G05G 5/05
2019/0146544 A1* 5/2019 Shimizu ................... G05G 1/04
74/523

FOREIGN PATENT DOCUMENTS

| | | | |
|---|---|---|---|
| EP | 3168854 A1 | 5/2017 | |
| EP | 3174081 A1 | 5/2017 | |
| EP | 3677983 A1 | 7/2020 | |
| FR | 2823368 | 10/2002 | |
| GB | 2569578 A | 6/2019 | |
| WO | WO-2010058758 A1 * | 5/2010 | ............ E02F 9/2004 |
| WO | WO-2013083841 A1 * | 6/2013 | ........... H01H 19/001 |

OTHER PUBLICATIONS

International Search Report in counterpart PCT/FR2022/050897 (mailed on Jul. 22, 2022).

* cited by examiner

CONTROL DEVICE

CROSS-REFERENCE TO RELATED APPLICATIONS

This application is a U.S. National Stage Application pursuant to 35 U.S.C. § 371 of International Patent Application PCT/EP2022/050897, filed on May 10, 2022, and published as WO 2022/238657 on Nov. 17, 2022, which claims priority to French Patent Application 2104981, filed on May 11, 2021, all of which are incorporated herein by reference in their entireties for all purposes.

FIELD OF THE INVENTION

The present invention relates to a control device such as a thumbwheel controller.

PRIOR ART

Thumbwheel control devices are intended to be mounted on control grips, control sticks any other control application of different machines requiring accurate control.

A control device of this type comprises a fixed body, on which is mounted an actuator movable in rotation around an axis. For an accurate control device, the travel is typically limited by mechanical stops, to limit the angular movement to 25° For example in the two directions.

The movable actuator also comprises a detectable element, for example a magnet, the movement of which is detected by a sensor, for example a Hall-effect sensor, arranged in the body. Said sensor produces an electrical signal proportional to the angular amplitude of the movement of the actuator.

The control device is typically provided with a means for returning to the rest position, which can be a torsion spring. The branches of said spring are arranged supported on a pair of contact surfaces arranged on the rotor of the movable actuator, and a pair of fixed stops on the lower portion of the body. What is meant by lower portion is the portion comprised between the axis of rotation and the portion of the body including the sensor. When a force is exerted on the actuator in order to pivot it around its axis, the torsion spring is stressed against the stops on the side of the direction of movement. As soon as the force on the actuator ceases, the torsion spring expands and the actuator returns to its rest position.

However, there often exists a residual mechanical clearance around the rest position in a configuration of this type.

FIGS. 1A and 1B illustrate the appearance of a clearance of this type between the branches of the torsion spring 7 and the support surfaces. Referring to FIG. 1A, said clearance 41 can appear between the torsion spring 7 and the stops 8 arranged in the body. Otherwise, with reference to FIG. 1B, said clearance 42 can appear between the torsion spring 7 and the contact surfaces 14 comprised in the rotor 13 of the actuator 1.

Said residual clearance can be more or less large depending on the manufacturing tolerances of the parts, yet it is inevitable due to the static indeterminacy of the connection. Said clearance allows movements comprised between 0.4 and 1 mm, corresponding to an angular value running from 2° to 5°, which cannot be detected by the sensor. A residual clearance of this type thus strongly limits the accuracy of the device.

Improvements are to be expected regarding the accuracy of control devices, particularly in proximity to the rest position. In addition, improvements are expected regarding the sealing of the device.

DISCLOSURE OF THE INVENTION

One object of the invention is to design a control device capable of tilting on an axis with a return to center with no residual mechanical clearance. To this end, the invention proposes a control device comprising:
  a body comprising a printed circuit,
  an actuator movable pivotingly relative to the body around an axis of rotation,
  a torsion spring comprising two end strands supported on two respective support surfaces of the actuator, said torsion spring being arranged to drive the actuator in rotation toward a rest position,
  at least one magnet rigidly secured to the actuator, and
  a magnetic field sensor arranged on the printed circuit facing the magnet, suitable for detecting the angular position of the magnet and for producing an electrical signal depending on said detected angular position,
characterized in that it comprises two stops rigidly secured to the body, a respective elastic element being arranged between each stop and the body, each stop comprising a support surface on a respective end strand of said torsion spring.

Advantageously, the elastic elements are compression springs.

Each stop comprises a head comprising the respective support surface and a pin extending from the head, each compression spring being arranged around said pin.

Each of the support surfaces of the stops and each of the support surfaces of the actuator are located on the same side of the respective end strand of the torsion spring.

Said elastic elements are in a stressed state.

Said stops are rigidly secured to the body by immersion in a resin.

In certain embodiments, the control device comprises two second stops limiting the rotation of the actuator around the axis, said second stops being rigidly secured to the actuator.

The second stops limiting the rotation around the axis are, at the end of their travel, in contact with the contact surfaces arranged in the body.

The invention also relates to a manufacturing method of a control device as described above, comprising the following steps:
  supplying the actuator and the torsion spring,
  arranging said torsion spring around the axis of rotation of the actuator, the end strands of the torsion spring being supported on the support surfaces of the actuator,
  supplying the body, the body comprising the two stops driven toward the actuator by the elastic elements,
  inserting the actuator and the torsion spring into the body, the end strands of the torsion spring being supported on the stops and compressing the elastic element,
  immobilizing the stops relative to the body.

Assembly while compressing the elastic elements allows making up for any residual mechanical clearance, by ensuring a firm contact of the torsion spring strands simultaneously with the stops and with the support surfaces. The accuracy of the control device is thus optimized, particularly around the neutral position.

BRIEF DESCRIPTION OF THE FIGURES

Other features and advantages of the invention will be revealed by the detailed description which follows, with reference to the appended drawings, in which.

DETAILED DESCRIPTION OF EMBODIMENTS

Figure 1A:
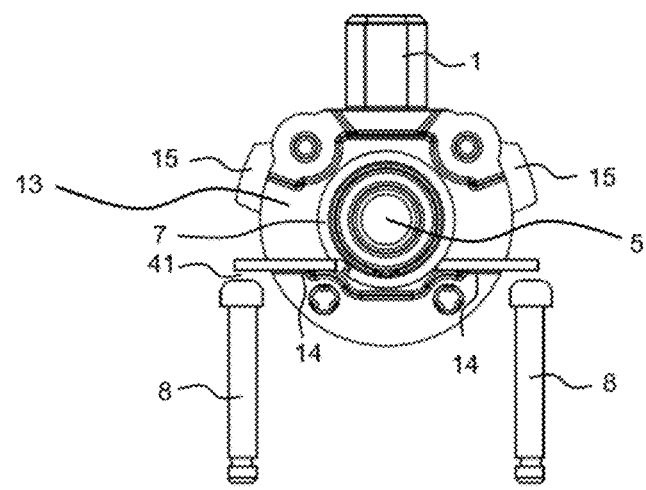
FIGS. 1A and 1B illustrate the residual clearance which can appear at two places in a control device of known type.
Figure 1B:
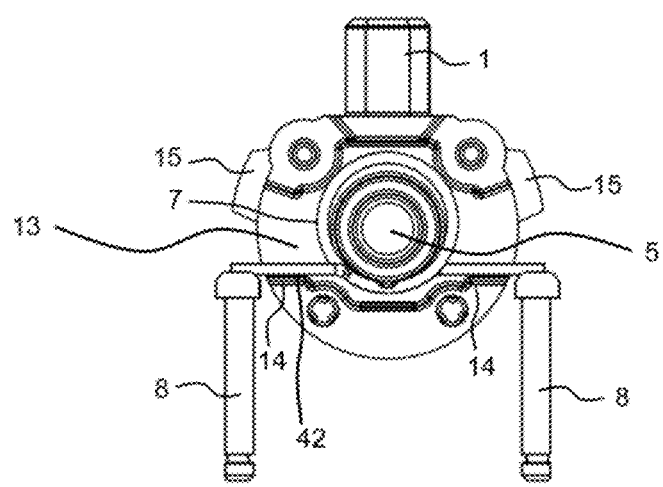
Figure 2:
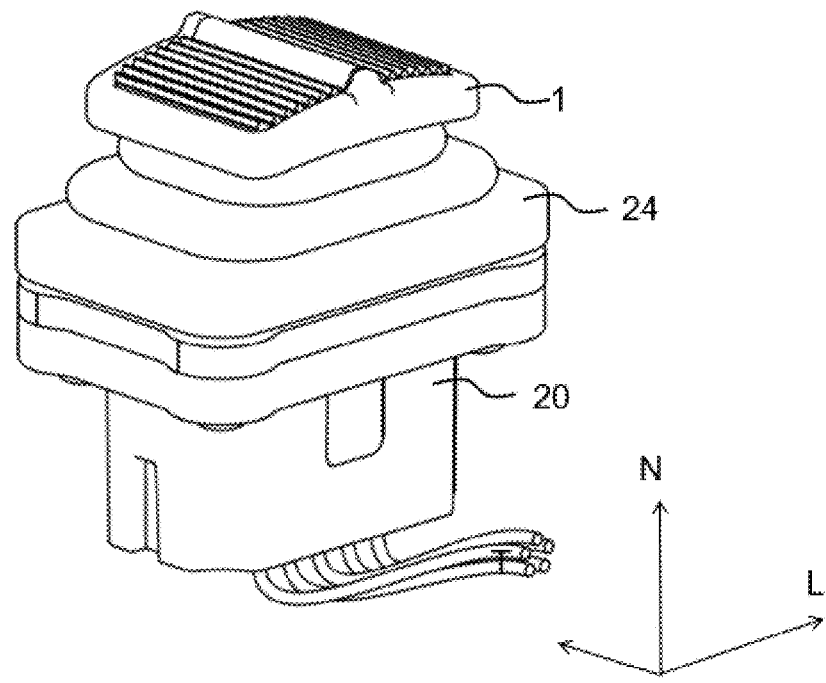
FIG. 2 is a perspective view of a control device according to the invention.

A control device according to the invention comprises a fixed body 20, an actuator 1 movable pivotingly relative to the body 20 around an axis 50 of rotation, and a means of detecting the position of the actuator 1. FIG. 2 is a schematic view of a control device of this type, assembled.

For the sake of clarity and simplification we will use a top-to-bottom orientation as shown in FIG. 2, the body 20 being arranged vertically with the actuator 1 positioned "on top" of the control device. Thus the terms "low," "high," "above," "below," "upper," "lower" as well as "horizontal" and "vertical" will serve for the description, without however limiting the invention.

The longitudinal axis L and the transverse axis T then define a "horizontal" plane and the neutral axis N is "vertical."

Figure 3A:
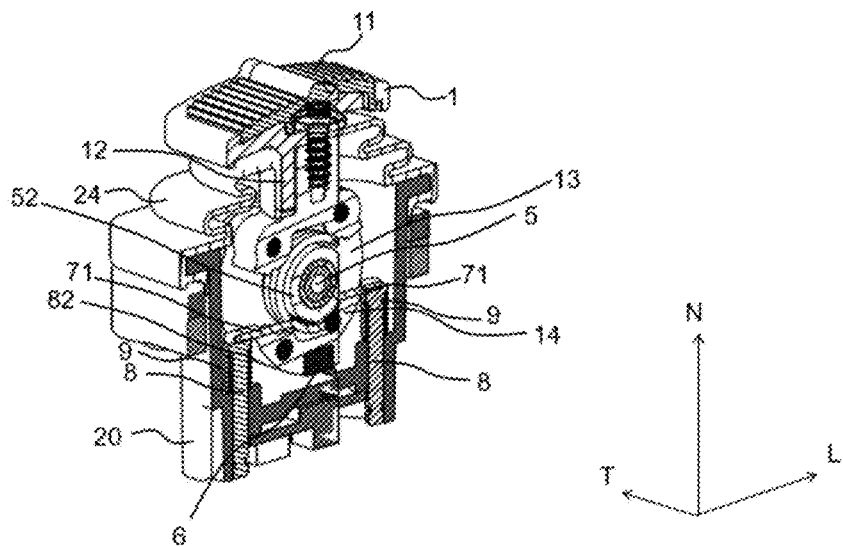
FIGS. 3A and 3B are section views of a control device according to the invention.
Figure 3B:
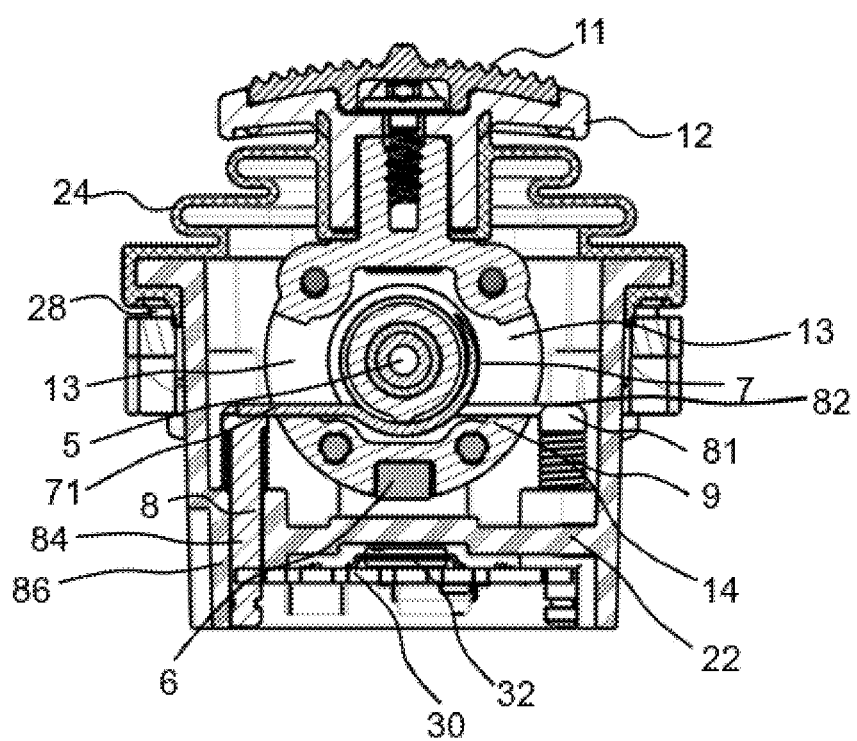
Figure 4:
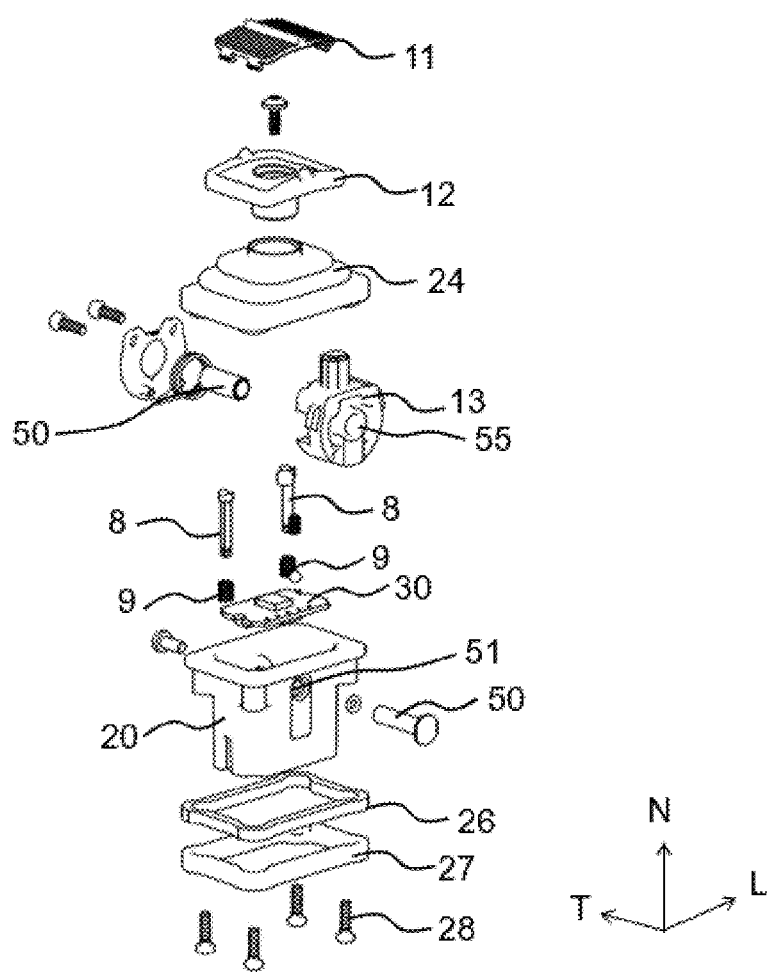
FIG. 4 is an exploded view of a control device according to the invention.

With reference to FIGS. 3A, 3B and 4, the fixed body 20 is hollowed in its interior to house there a rotor 13 constituting the lower portion of the actuator 1 and the other components of the control device. Said body 20 appears typically in the form of an essentially parallelepiped box. The body 20 comprises a bottom 22, which is advantageously essentially rectangular, and a housing 23 arranged below said bottom 22, said housing 23 comprising a printed circuit 30 bearing a sensor 32, the function of which will be described subsequently. Cables can be connected to the printed circuit 30.

The bottom 22 also comprises two top-to-bottom through openings 86, which can appear, by way of an illustrative and non-limiting example, in the form of two cylindrical holes, arranged on the sides of the bottom 22 parallel to the transverse axis T.

Figure 7:
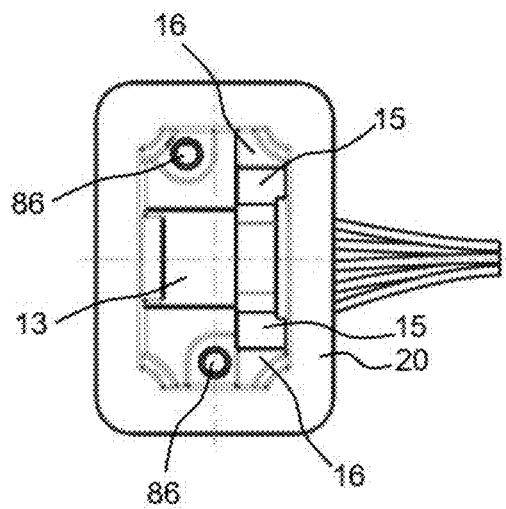
FIG. 7 is a top view of the body and of the rotor, illustrating the arrangement of the openings and of the contact surfaces.

Advantageously, the openings 86 are arranged asymmetrically as illustrated in FIG. 7, their offset relative to the plane formed by the longitudinal axis L and the vertical axis N corresponding to the offset of the strands 71 of the torsion spring 7 relative to said plane. Advantageously, the openings 86 are arranged on the narrow sides of the bottom 22.

Two first stops 8 are arranged inside the body 20 and are rigidly secured to said body 20. Said first stops 8 each comprise a head 81 comprising a respective support surface 82 and a respective pin 84 extending from the head 81, each of the pins 84 passing through one of the openings 86 comprised in the bottom 22. Each first stop 8 comprises an elastic element 9 arranged around the respective pin 84 of the stop 8. Advantageously, said elastic element 9 is a compression spring. Each of the elastic elements 9 is in a stressed state between the respective head 81 of each first stop 8 and the bottom 22 of the body 20. Although, in the assembled state shown in FIGS. 3A and 3B, the stops 8 are fixed relative to the body 20 and the drive applied by the elastic element 9 does not cause movement of said stops, the elastic elements 9 have a particular advantage during the assembly of the controller for obtaining a clearance-free assembly between the return spring of the actuator and the stops 8, as will be explained in detail below.

The body 20 also comprises two openings 51 arranged symmetrically on two vertical surfaces parallel to the longitudinal axis L, said vertical surfaces advantageously being the long sides of the body 20. Each opening 51 is arranged in the middle of the surface along the longitudinal axis L. The openings 51 are advantageously cylindrical holes, receiving a shaft 5 along an axis 50 of rotation of the movable element. The shaft 5 is preferably of cylindrical shape and can include attachments allowing holding said shaft 5 in the openings 51. The shaft 5 is secured to the body 20 at the openings 51. Advantageously, the shaft 5 includes a cylindrical spacer limiting friction during rotation and the mechanical clearance around the axis of rotation.

The body 20 also comprises a membrane 24 arranged so as to close the body at the top, said membrane 24 including an opening able to allow a portion of the actuator 1 to cross. Said membrane 24 is able to form a liquid-tight seal between the vertical walls of the body 20 and the actuator 1. Advantageously, the membrane 24 consists of an elastomer. Preferably, the membrane is attached to the actuator 1 and to the body 20 by clamping between two surfaces assembled with screws.

The body 20 can comprise, on its lower side, a coating of resin 25 arranged so as to immobilize the first stops 8 relative to the body 20. Advantageously, the coating of resin 25 is able to form a liquid-tight seal covering the printed circuit 30, the housing 23 and the bottom 22 of the body 20.

The body 20 can be attached to a support such as a panel or a machine by means of a mounting panel 26 and a cradle 27 by tightening the screws 28.

The movable actuator 1 comprises a cover 11, a lever 12 and a rotor 13, which is essentially cylindrical.

The cover 11 is intended to be manipulated by the user. Said cover 11 can be designed according to the esthetic requirements of the apparatus in which the control device will be used, or comprise information such as a logo or a pictogram. It can also comprise a gripping surface allowing preventing the finger of a user from sliding during the use of the control device, or any other appropriate surface depending on the ergonomics and the esthetics that it is desired to give the device.

The lever 12 connects the cover 11 with the rotor 13. Said lever 12 preferably has an elongate shape, allowing the rotary movement occurring upon the manipulation of the cover 11 to be transmitted to the rotor 13.

The rotor 13 is arranged inside the body 20 and comprises a cylindrical bore 55, along the axis 50 of rotation of the actuator 1. The shaft 5 is arranged so as to cross said bore 55 along the axis 50 of rotation, allowing the pivoting of the rotor 13 around this axis 50.

The rotor 13 comprises a cyclic portion 52 in relief around the cylindrical bore 55, said cyclic portion 52 being able to receive a torsion spring 7. Said torsion spring 7 is arranged so as to surround the cyclic portion 52, and thus align the annular portion of said torsion spring 7 with the cylindrical bore 55 of the rotor 13. The pivot shaft 5 is mounted so as to cross the annular portion of the torsion spring 7, the cyclic portion 52 and the bore 55 along the axis 50 of rotation.

The torsion spring 7 comprises two end strands 71 supported on two respective support surfaces 14 arranged on the lower portion of the rotor 13, below the strands of the torsion spring 7 and secured to said strands 71. The end strands 71 are also in contact with the support surfaces 82 of the respective first stops 8 arranged in the body 20. The torsion spring 7 has a compression force greater than the compression force of the elastic elements 9.

Two second stops 15 can be arranged facultatively on the upper portion of the rotor 13, having two contact surfaces facing a pair of contact surfaces 16 arranged in the body 20.

The rotor 13 of the actuator also comprises a magnet 6 rigidly secured to said rotor 13. Advantageously, the magnet 6 is arranged at the bottom of the rotor 13 facing the magnetic field sensor 32 of the printed circuit 30.

When the actuator 1 is in the neutral position, the lever 12 is parallel to the neutral axis N and the cover 11 is oriented upward. In this position, the torsion spring 7 is subjected to a minimum stress. The magnet 6 is in its lowest position and closest to the magnetic field sensor 32. If applicable, the two second stops 15 have no contact with the first stops 8.

When the actuator 1 is in an inclined position, the lever 12 forms an angle relative to the axis N in the plane defined by the neutral axis N and the longitudinal axis L. The inclination can appear in a negative or positive direction. The torsion spring 7 undergoes a greater stress than in the neutral position and drives the actuator 1 in rotation toward the neutral position. The magnet 6 is offset from its neutral position in the opposite direction to the inclination of the lever 12. If applicable, one of the two second stops 15 is brought closer to the head 81 of the first stop 8 arranged facing said second stop, and the other second stop 15 is moved away from the head 81 of the respective first stop 8, relative to the neutral position.

When the inclination of the actuator 1 is a maximum, if applicable, the second stop 15 arranged on the side to which the lever 12 is inclined is supported on the surface 16 arranged on the same side in the body 20, thus limiting the rotation of the actuator 1 around the axis 50. The angle between the lever 12 and the axis N can reach, by way of an illustrative and non-limiting example, 25° or 30° in the position of maximum inclination.

When a user begins to manipulate the movable portion of the actuator 1, said actuator 1 is in motion from the neutral position toward an inclined position. The magnet 6 is then in motion in the opposite direction to the inclination of the lever 12. The magnetic field sensor 32 detects the angular position of the magnet 6 and produces an electrical signal depending on said detected angular position. The user can then carry out a manipulation in the same direction or in the opposite direction, and the sensor again detects the angular position of the magnet 6. The user can continue the manipulations, which will be detected in the same manner, or release the actuator 1 in any position.

When the user releases the actuator 1 in an inclined position, the torsion spring 7 drives the actuator 1 toward its neutral position. The magnetic field sensor 32 detects the return of the magnet 6 to the neutral position and produces a corresponding electrical signal.

The magnetic field sensor 32 can be a sensor which detects the movement of a magnet 6. Alternatively, the magnetic field sensor can be a sensor which detects the position of a magnet 6. Advantageously, the magnetic field sensor 32 is a Hall-effect sensor.

The assembly steps of the control device will now be described.

Figure 5A:
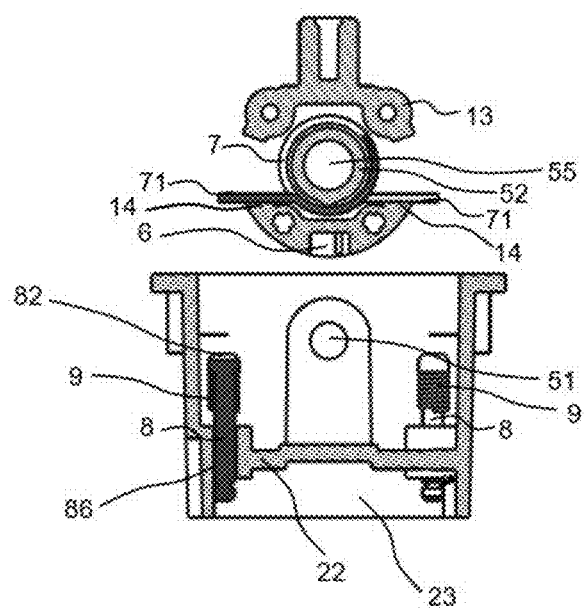
FIGS. 5A-D illustrate the assembly steps of a control device according to the invention, in which the rotor of the movable actuator including the magnet and the torsion spring are inserted into the body while compressing the elastic elements arranged on the stops comprised in the body of the control device.

The first step is illustrated in FIG. 5A. Starting with the body 20, which can comprise the printed circuit 30 and the sensor 32, the pins 84 of the first stops 8 are inserted into the openings 86 comprised in the bottom 22. The pins include the elastic elements 9 which are thus arranged between the heads 81 and the openings 86. During this step, the elastic elements 9 do not undergo any stress. Simultaneously, the torsion spring 7 is mounted on the cyclic portion 52 in relief on the rotor 13 of the actuator 1, the strands 71 being in firm contact with the support surfaces 14.

Figure 5B:
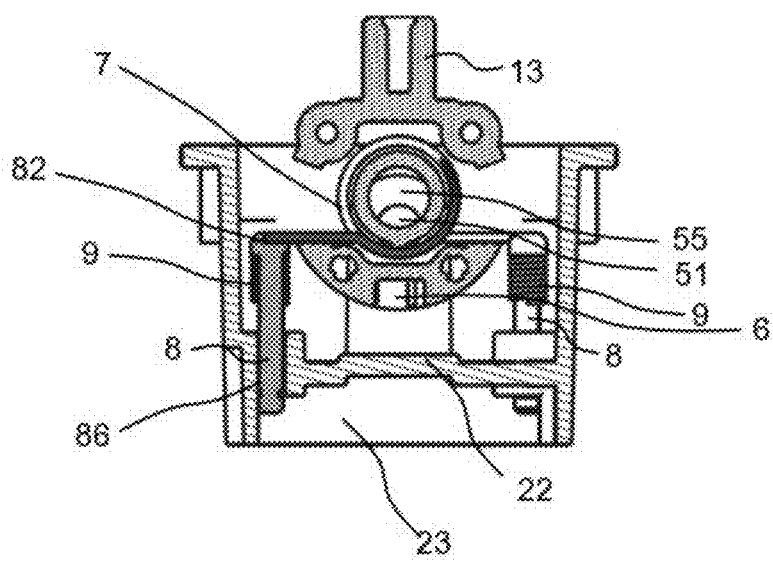

In a second step, with reference to FIG. 5B, the rotor 13 of the actuator 1, including the magnet 6 and the torsion spring 7, is inserted into the body 20, by aligning the bore 55 with the openings 51. The ends of the strands 71 of the torsion spring 7 are supported on the first stops 8, by compressing the respective elastic elements 9 arranged on the pins 84 of said stops 8. The first stops 8 slide in the openings 86 in the bottom 22. The compression force of the elastic elements 9 being less than the compression force of the torsion spring 7, the torsion spring 7 does not undergo deformation during this step.

Figure 5C:
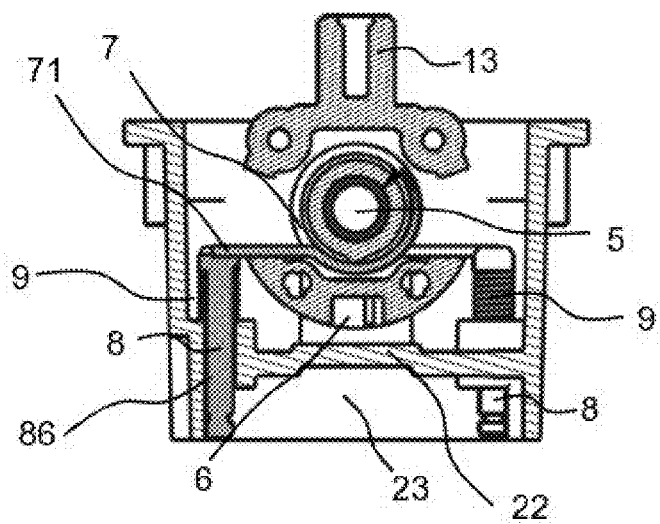

In a third step, with reference to FIG. 5C, the shaft 5 is inserted into the openings 51 and the cylindrical bore 55 along the axis 50 of rotation. The elastic elements 9 are stressed, thus allowing arranging the torsion spring 7 with a symmetrical stress on the stops 8 of the two respective sides in the rotor 13 and the support surfaces 14 of the two respective sides of the actuator 1. Due to the drive exerted by the elastic elements 9, no gap can exist between the strands 71 of the torsion spring 7 and the stops 8. This arrangement has the effect of preventing any residual mechanical clearance in the switch.

The printed circuit 30 including the sensor 32 can be inserted into the body before or after each of said steps.

Figure 5D:
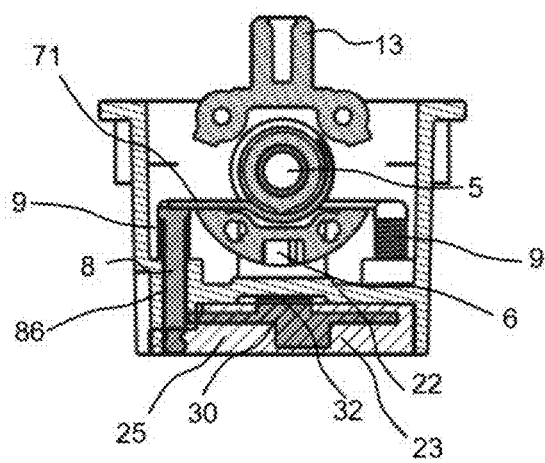
Figure 6:
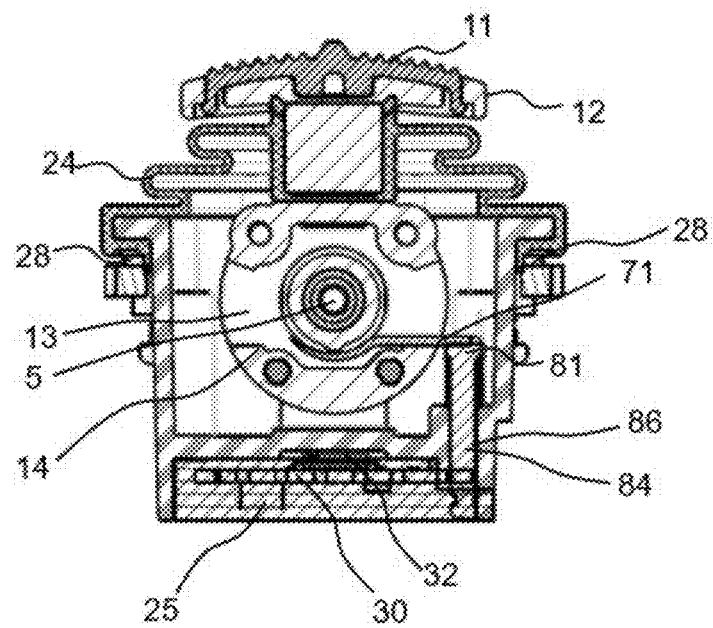
FIG. 6 is a section view of the device illustrating the assembly of the membrane and the arrangement of the resin sealing the housing against liquids.

In a fourth step, with reference to FIG. 5D, the stops 8 are immobilized relative to the body 20, in the position imposed by the driving of the elastic elements 9, which allows preventing any clearance between the stops and the strands 71 of the torsion spring. The immobilization can be carried out, purely by way of illustration and without limitation, by pouring a resin 25 into the lower portion of the body, by immersion of the lower portion of the body in a resin, by gluing or by welding. When the immobilization is carried out by a means other than a resin, a coating of resin can be applied after immobilization. In this case, the printed circuit 30 including the sensor can be inserted into the body after the immobilization of the stops and, if applicable, prior to the application of the resin coating.

The application of a coating of resin 25 also has the effect of making the box liquid-tight at the bottom 22.

After said assembly steps, the device includes no residual mechanical clearance, particularly around the neutral position of the movable element.

The membrane 24 is attached to the body 20 after assembly of the different components arranged inside the body 20. The lever 12 and the cover 11 are arranged on the rotor 13 of the actuator 1.

The control device can then be mounted on a support such as a panel or a machine by means of the mounting panel 26, of an optional attachment spacer, and of the cradle 27, by tightening the screws 28. A portion of the membrane 24 is arranged between the body 20 and the mounting panel 26. The tightening of the screws 28 has the effect of clamping the body 20 against the mounting panel 26 and thus compressing said portion of the membrane 24, making the device liquid-tight on the upper side.

The invention claimed is:

1. A control device comprising:
   a body comprising a printed circuit,
   an actuator movable pivotally relative to the body around an axis 50 of rotation,
   a torsion spring comprising two end strands supported on two respective support surfaces of the actuator, said torsion spring being arranged to drive the actuator in rotation toward a rest position,
   at least one magnet rigidly secured to the actuator,
   a magnetic field sensor arranged on the printed circuit facing the magnet, suitable for detecting the angular position of the magnet and for producing an electrical signal depending on said detected angular position,
   two stops rigidly secured to the body, a respective elastic element being arranged between each stop and the body, each stop comprising a support surface on a respective end strand of said torsion spring.

2. The control device according to claim 1, wherein the elastic elements are compression springs.

3. The control device according to claim 2, wherein each stop comprises a head comprising the respective support surface and a pin extending from the head, each compression spring being arranged around said pin.

4. The control device according to claim 1, wherein each of the support surfaces of the stops and each of the support surfaces of the actuator are arranged on a same side of a respective end strand of the torsion spring.

5. The control device according to claim 1 preceding claims wherein said elastic elements are in a stressed state.

6. The control device according to claim 1 preceding claims, wherein said stops are rigidly secured to the body by immersion in a resin.

7. The control device according to claim 1, comprising two second stops limiting the rotation of the actuator around the axis, said second stops being rigidly secured to the actuator.

8. The control device according to claim 7, wherein the second stops limiting the rotation around the axis are, at the end of their travel, in contact with contact surfaces arranged in the body.

9. A manufacturing method for a control device according claim 1, comprising:
   supplying an actuator and a torsion spring,
   arranging said torsion spring around an axis of rotation of the actuator, end strands of the torsion spring being supported on support surfaces of the actuator,
   supplying a body, the body comprising two stops driven toward the actuator by elastic elements,
   inserting the actuator and the torsion spring into the body, the end strands of the torsion spring being supported on the stops and compressing the elastic elements,
   immobilizing the stops relative to the body.

* * * * *